United States Patent [19]

Martiny

[11] Patent Number: 4,797,581

[45] Date of Patent: Jan. 10, 1989

[54] CIRCUIT FOR CONVERTING TRI-STATE SIGNALS INTO BINARY SIGNALS

[75] Inventor: Ingo A. Martiny, Hamburg, Fed. Rep. of Germany

[73] Assignee: U.S. Philips Corporation, New York, N.Y.

[21] Appl. No.: 51,810

[22] Filed: May 18, 1987

[30] Foreign Application Priority Data

May 17, 1986 [DE] Fed. Rep. of Germany ....... 3616818

[51] Int. Cl.⁴ .................. H03K 19/092; H03K 19/00; H03K 17/60
[52] U.S. Cl. .................... 307/475; 307/443; 307/459; 307/473; 307/248
[58] Field of Search ............... 307/473, 475, 443, 459, 307/248

[56] References Cited

U.S. PATENT DOCUMENTS 4,581,550  4/1986  Ferris et al. ................ 307/443

FOREIGN PATENT DOCUMENTS 0215824  12/1983  Japan .......................... 307/473
0875381  11/1959  United Kingdom ........... 307/443

*Primary Examiner*—John S. Heyman
*Assistant Examiner*—M. R. Wambach
*Attorney, Agent, or Firm*—Bernard Franzblau

[57] ABSTRACT

A circuit for converting tri-state signals into binary signals comprises two current sources, each of which is connected to a common input via a respective diode path and to a respective output transistor via a further respective diode path. Depending on the potential on the input, either one of the two output transistors or both output transistors carry an output direct current.

8 Claims, 2 Drawing Sheets

CIRCUIT FOR CONVERTING TRI-STATE SIGNALS INTO BINARY SIGNALS

BACKGROUND OF THE INVENTION

This invention relates to a circuit arrangement for converting tri-state signals into binary signals. In known circuits of this kind, one or more binary voltage dividers are used in order to define a reference voltage range which is situated between the potential of the positive and that of the negative supply voltage source.

When the current consumption of such a circuit must be low, use must be made of high-ohmic voltage dividers which are difficult to realise by means of an integrated circuit technique.

SUMMARY OF THE INVENTION

It is an object of the present invention to provide a circuit arrangement of the kind set forth which does not comprise ohmic voltage dividers.

This object is achieved in accordance with the invention in that there are provided a first direct current source which is unilaterally connected to the negative supply voltage terminal and a second direct current source which is unilaterally connected to the positive supply voltage terminal of a supply voltage source, a respective free terminal of the first and second current source being connected to a common input via a first and a second diode path, respectively and, via a third and a fourth diode path which are similar to the first and the second diode path, respectively, to a first and a second output transistor, respectively, which supplies an output signal.

The diode paths may comprise one or more diode elements which are connected in series and in the forward direction. When the potential at the common input is positive, the current of the first current source will flow to the common input via the first diode path and no current will be applied to the output transistor connected to the third diode path. However, the current of the second current source then flows via the fourth diode path to the output transistor connected thereto.

However, when the potential on the common input becomes sufficiently negative, the current of the second current source will flow to the common input via the second diode path. No current will be applied to the fourth diode path so that it will not be applied to the output transistor coupled thereto. Instead, the current supplied by the first current source then flows via the third diode path to the output transistor coupled thereto.

In an intermediate potential range the current of the two current sources will flow to the two output transistors only via the third and the fourth diode path.

If the third and the fourth diode path were connected directly to the input respectively, for example, to the base of the associated output transistor, these transistors should be of conductivity types complementary to each other and should be connected to opposite supply voltage terminals. The potentials which appear at their outputs, notably their collectors, and which represent the binary output signals will then be dependent on the value of the supply voltage. This can be avoided in a further embodiment in accordance with the invention in that of the third and the fourth diode path, one is connected directly to the first or the second output transistor, respectively, the other one being connected thereto via a current mirror, the two output transistors being connected in the same sense. The output transistors may then be of the same conductivity type and may be connected to the same supply voltage terminal.

When no current flows via the third or the fourth diode path, the current sources do not apply a current to the bases of the output transistors, so that these transistors are turned off. In order to achieve reliable turning off as well as a defined transition from the turned-on state to the turned-off state, a further embodiment in accordance with the invention comprises a switching transistor which is connected parallel to the input of at least one of the output transistors and which can be controlled by the output current of a current mirror whose input current is formed by the current flowing via the first or the second diode path, respectively. The input of one output transistor is then short-circuited by the parallel-connected switching transistor so that any residual currents cannot reach the output transistor.

In a preferred embodiment in accordance with the invention, the transistors which are included in the circuit and whose emitters are connected to the negative supply voltage terminal are constructed by means of the I²L technique, the base currents of these transistors being supplied by a common injector. In this embodiment, crystal surface area can be saved when the circuit is constructed according to the integrated circuit technique and the currents of the current sources, supplied by the injector, may be comparatively small.

BRIEF DESCRIPTION OF THE DRAWING

The invention will be described in detail hereinafter with reference to the drawing, in which.

DESCRIPTION OF THE PREFERRED EMBODIMENTS

Figure 1:
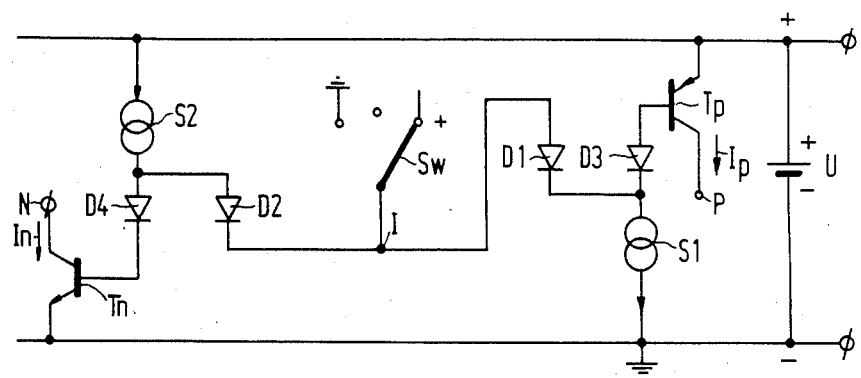
FIG. 1 shows a simplified circuit diagram of a circuit in accordance with the invention.

FIG. 1 shows a first direct current source S1, one terminal of which is connected to the negative supply voltage terminal which is connected to ground, and a second direct current source S2, one terminal of which is connected to the positive supply voltage terminal of a supply voltage source U. The respective other terminal of the first and the second direct current source, supplying a direct current of, for example 1 μA, is connected, via a first and a second diode path, D1 and D2 respectively, to a common input I on which the tri-state signal to be converted is present. Moreover, the free terminals of the current sources S1 and S2, respectively, are connected to the base connection of a pnp output transistor Tp and to a base connection of a npn output transistor Tn, respectively, via a third diode path D3 which is similar to the first diode path D1 and via a fourth diode path D4 which is similar to the second diode path, respectively. The output transistors have their respective emitters connected to the positive and the negative supply voltage terminals, respectively, their collectors forming the outputs P and N, respectively, of the circuit. An evaluation circuit (not shown) which is preferably constructed according to the I²L technique is connected to the outputs P and N and processes the binary output signals appearing on these outputs.

A tri-state input voltage signal Ui is supplied to the common input terminal I. This is shown symbolically by means of the 3-position switch Sw, each position or contact representing one of the three logic states of the input voltage Ui. The common input I thus is connected via the switch Sw so that, in accordance with the position of the switch, the common input I is either not connected (floating), or connected to ground or to the positive supply voltage.

Figure 2A:
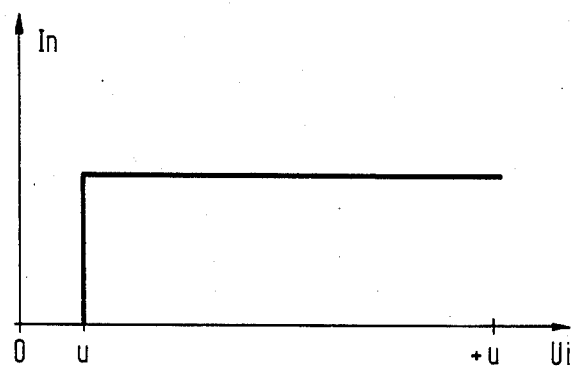
FIGS. 2a and 2b show the variation of the currents of the output transistors as a function of the input voltage.
Figure 2B:
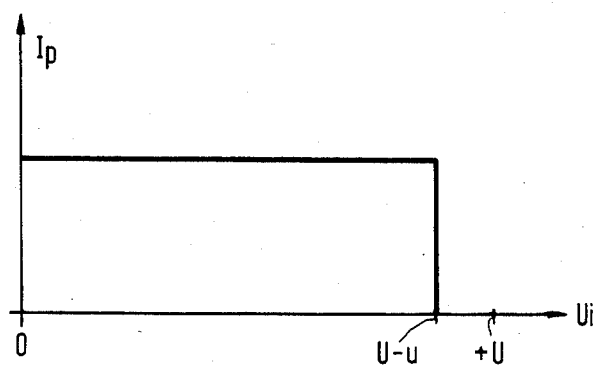

FIGS. 2a and 2b show the variation of the output currents In and Ip of the output transistors Tn and Tp as a function of the voltage Ui on the common input I. When the voltage on the common input amounts to Zero voltage or is at least greater than the emitter-base voltage u of the transistor Tn, the bias voltage of the diode path D2 in the forward direction will be higher than the corresponding bias voltage of the diode path D4. Therefore, substantially the entire current of the current source S2 will flow to the input via the diode path D2. The transistor Tn does not receive a base current so that the current In on the output N is substantially zero. On the other hand, in the case of ground potential on the input I, the diode path D3 is conductive and the diode path D1 is blocked. The total current of the current source S1 thus flows, via the diode path D3, into the base of the transistor Tp so that a current, that is to say the collector current of the transistor Tp, will flow at the output P.

The described situation prevails for as long as the voltage on the input I remains smaller than the base-emitter voltage of the transistor Tn.

When the voltage on the input I exceeds the base-emitter voltage u of the transistor Tn, the bias voltage of the diode path D4 in the forward direction becomes higher than the corresponding voltage on the diode path D2. The current of the current source S2 then flows into the base of the transistor Tn and, consequently, a current In, i.e. the collector current of the transistor Tn, appears at the output N. The output transistor Tp remains turned on for as long as the potential on the input I remains more negative than the base potential of the output transistor Tp.

In this state, therefore, both output transistors carry an output current. The same is applicable when the input I remains unconnected, because in that case no current can flow via the input I. Current cannot flow either from the current source S2 to the current source S1 via the diode paths D2 and D1 when the supply voltage U is higher than the sum of the base-emitter voltage of one output transistor, the forward voltage of one of the diode paths D3 or D4, and the operating voltage of the current source S1 or S2.

When the voltage Ui on the input I becomes more positive than the voltage on the base of the transistor Tp (with respect to ground), the current of the current source S1 will flow via the diode path D1, and the output transistor Tp is turned off, i.e. the output current Ip becomes zero. In this state the current of the current source S2 continues to flow, via the diode path D4, to the input of the transistor Tn so that an output current In flows. No current flows via the diode path D2.

The circuit shown in FIG. 1 converts a tristate signal on the input I into a binary signal on the outputs N and P as follows:

(a) In the input voltage range $0 < Ui < u$ the output transistor Tn does not carry an output current and the output transistor Tp carries a current.
(b) In the input voltage range $u < Ui < U-u$ or in the case of a non-connected input, both output transistors carry an output current.
(c) In the input voltage range $U-u < Ui < U$ the output transistor Tn carries an output current and the output transistor Tp does not carry an output current.

Figure 3:
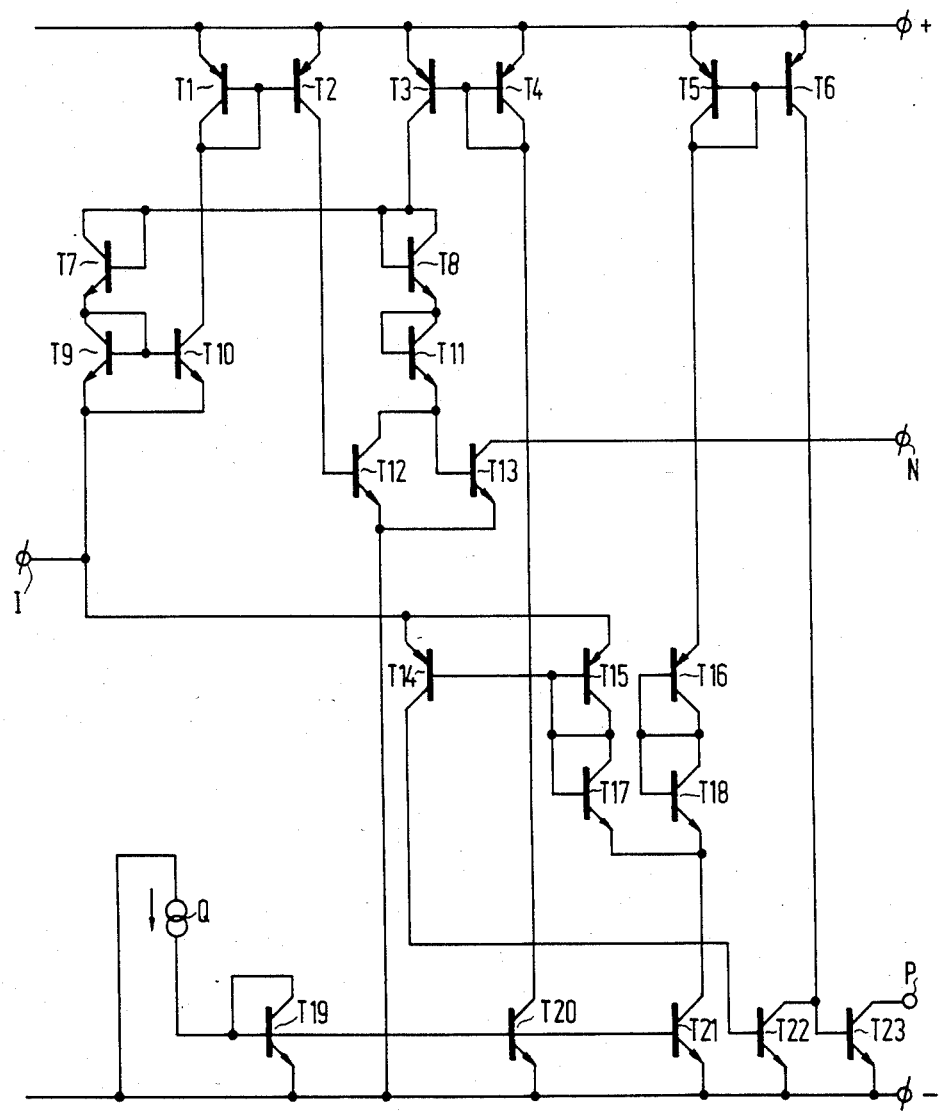
FIG. 3 shows the circuit diagram of a preferred embodiment in accordance with the invention.

FIG. 3 shows a preferred embodiment in accordance with the invention.

Therein, the first current source S1 is formed by the collector-emitter path of an npn transistor T21 whose emitter is connected to the negative supply voltage terminal and whose collector is connected to the first and the third diode paths. The first diode path is formed by the series connection of an npn transistor T17, acting as a diode because its collector is connected to its base, and a pnp transistor T15 which is also connected as a diode. The third diode path has a similar construction and consists of the series connection of the npn transistor T18 and the pnp transistor T16 which are also connected as diodes.

The current source S2 is formed by the collector-emitter path of a transistor T3 whose emitter is connected to the positive supply voltage terminal and whose collector is connected to the second and the fourth diode path. The second diode path is formed by the npn transistors T7 and T9 which are connected as diodes and the fourth diode path is formed by the transistors T8 and T11 which are also connected as diodes.

A transistor T13 whose base is connected, via the fourth diode path T8, T11 to the second current source T3, and whose emitter is connected to ground, functions as the output transistor Tn. However, the third diode path is not directly connected to the base of the npn output transistor T23 whose emitter is connected to the negative supply voltage terminal. It is connected instead to the input of a current mirror which is formed by the transistors T5 and T6 and whose output is connected to the base of the transistor T23. The inclusion of the current mirror T5, T6 offers the advantage that transistors of the same type of conductivity can be used for the output transistors.

The first current source T21 is formed by an output of a current mirror whose input is formed by an npn transistor T19 which is connected as a diode and whose other output is formed by a transistor T20 whose base-emitter path is connected parallel to the base-emitter path of the transistor T21. The collector of the transistor T20 is connected to a pnp transistor T4 which is connected as a diode and whose emitter is connected to the positive supply voltage terminal, thus forming a current mirror in conjunction with the transistor T3. Therefore, the current of the current source T3 exactly equals the current of the current source T21. The input current of the current mirror T19, T20, T21 is supplied by a current source Q and amounts to, for example 1 μA.

In order to ensure a reliable turn-off of the output transistors T13 and T23, the collector-emitter path of a transistor T12, T22, respectively, is connected parallel to the base-emitter paths of the transistors T13 and T23, respectively. The transistor T12 is fed by the output of a current mirror T1, T2 whose input is connected to the output of a further current mirror which comprises a transistor T10 and a transistor T9. The transistor T9 is connected as a diode and forms part of the second diode path. The transistor T22 is controlled by the collector current of a transistor T14 which forms a current mirror in conjunction with the transistor T15 of the first diode path, which last transistor is connected as a diode. As soon as a sufficiently large current flows across the first diode path T15, T17 and the second diode path T7, T9 respectively, the output of the associated current mirror supplies a current which turns on the transistor T22 and T12, respectively, and which short-circuits the input of the output transistor T23 and T13, respectively.

The npn transistors T12, T13 and T19 ... T23 whose emitters are connected to the negative voltage supply terminal and ground, are preferably constructed by means of the I$^2$L technique. The current source Q can then be formed by a so-called injector transistor which, having a small crystal surface area, is suitable for generating sufficiently small currents, notably when it is used also for powering I$^2$L gates which form part of a further circuit provided on the same semiconductor substrate as the circuit shown in FIG. 3.

The supply voltage for the circuit shown in FIG. 3 needs to amount to only three times the base-emitter voltage of one of the transistors plus the collector-emitter saturation voltage. When the transistors T7, T8 and T17, T18 which are connected as diodes are omitted, the supply voltage may even be lower by an amount equal to the base-emitter voltage, so that the circuit can even be simpler while its properties remain the same.

The circuit not only processes stationary signals, as supplied by the circuit Sw in FIG. 1, but also alternating voltage signals.

What is claimed is:

1. A circuit arrangement for converting tri-state signals into binary signals comprising: an input terminal for receiving the tri-state signals, a first diode path connected between the input terminal and a first node and including a first diode having an anode connected to the input terminal, a first direct current source conducting a first current from the first node towards a low supply voltage terminal, a second diode path connected between the input terminal and a second node and including a second diode having a cathode connected to the input terminal, a second direct current source conducting a second current from a high supply voltage terminal towards the second node, a first output transistor having a main current path connected between one of the supply voltage terminals and a first output terminal for supplying a first controllable output current and having a control electrode coupled to the first node via a third diode path including a third diode having a cathode connected to the first node, and a second output transistor having a main current path connected between one of the supply voltage terminals and a second output terminal for supplying a second controllable output current and having a control electrode coupled to the second node via a fourth diode path including a fourth diode having an anode connected to the second node.

2. A circuit arrangement as claimed in claim 1 wherein the main current paths of the first and second output transistors are connected to a same first voltage supply terminal and wherein a current mirror, having a first and a second current branch, couples the control electrode of one of the output transistors via the relevant diode path towards the relevant node, the first current branch being connected between a second supply voltage terminal and the relevant diode path, the second current branch being connected between the second supply voltage terminal and the control electrode of the one output transistor.

3. A circuit arrangement as claimed in claim 2 wherein the control electrode of at least one output transistor is coupled to the supply voltage terminal to which its main current path is connected via a main current path of a switching transistor having a control electrode fed by a current mirror means for feeding said control electrode with a further current proportional to a control current through its respective first or second diode path.

4. A circuit arrangement as claimed in claim 3 wherein the current mirror means comprise a current mirror having a first current branch coupled to the control electrode of the switching transistor, and a second current branch comprising said respective diode path.

5. A circuit arrangement as claimed in claim 4 comprising first and second switching transistors which connect the control electrodes of the first and second output transistors, respectively, to the first supply voltage terminal, the control electrode of one of the switching transistors being coupled to the first current branch of the respective further current mirror via an additional current mirror having a first current branch coupled between said control electrode and the second supply voltage terminal, and having a second current branch coupled between the first current branch of the respective further current mirror and the second supply voltage terminal.

6. A circuit arrangement as claimed in claim 2 comprising a principal current mirror wherein a first current branch conducts a reference current and controls a second and a third current branch, said branches being connected to one of the supply voltage terminals, whereby the second current branch is connected between the first supply voltage terminal and one of the nodes, and whereby a first and a second current branch of an auxiliary current mirror are connected between the second supply voltage terminal and the third current branch and between the second supply voltage terminal and the other node, respectively.

7. A circuit arrangement as claimed in claim 1, wherein the circuit transistors which have respective emitters connected to the low supply voltage terminal are formed by means of an I$^2$L technique, base currents of said transistors being supplied by a common injector.

8. A circuit arrangement as claimed in claim 1, comprising a principal current mirror wherein a first current branch conducts a reference current and controls a second and a third current branch, said branches being connected to one of the supply voltage terminals, whereby the second current branch is connected between the first supply voltage terminal and one of the nodes, and whereby a first and a second current branch of an auxiliary current mirror are connected between the second supply voltage terminal and the third current branch and between the second supply voltage terminal and the other node, respectively, and wherein circuit transistors which have respective emitters connected to the low supply voltage terminal are formed by means of an I$^2$L technique, base currents of said transistors being supplied by a common injector.

* * * * *